United States Patent
Nagata et al.

(10) Patent No.: US 10,131,826 B2
(45) Date of Patent: Nov. 20, 2018

(54) ADHESIVE FILM FOR SEMICONDUCTOR CHIP WITH THROUGH ELECTRODE

(71) Applicant: SEKISUI CHEMICAL CO., LTD., Osaka (JP)

(72) Inventors: Mai Nagata, Osaka (JP); Kohei Takeda, Osaka (JP); Toshio Enami, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/304,950

(22) PCT Filed: Mar. 25, 2015

(86) PCT No.: PCT/JP2015/059176
§ 371 (c)(1),
(2) Date: Oct. 18, 2016

(87) PCT Pub. No.: WO2015/163080
PCT Pub. Date: Oct. 29, 2015

(65) Prior Publication Data
US 2017/0183548 A1    Jun. 29, 2017

(30) Foreign Application Priority Data

Apr. 22, 2014 (JP) ................................. 2014-088275

(51) Int. Cl.
*H01B 1/20* (2006.01)
*C09J 163/00* (2006.01)
(Continued)

(52) U.S. Cl.
CPC ............ *C09J 163/00* (2013.01); *C01B 33/18* (2013.01); *C08G 59/42* (2013.01);
(Continued)

(58) Field of Classification Search
CPC .... H01B 1/20; H01B 1/22; H01B 1/24; H01L 25/065; H01L 25/07; H01L 25/18
See application file for complete search history.

(56) References Cited

U.S. PATENT DOCUMENTS

| | | | |
|---|---|---|---|
| 2008/0213943 A1* | 9/2008 | Takamoto | H01L 24/27 438/118 |
| 2008/0241995 A1* | 10/2008 | Fukui | C08G 59/08 438/109 |
| 2013/0237018 A1* | 9/2013 | Dilao | H01L 24/83 438/118 |

FOREIGN PATENT DOCUMENTS

| | | |
|---|---|---|
| JP | 11-121538 | 4/1999 |
| JP | 2007-009022 | 1/2007 |

(Continued)

OTHER PUBLICATIONS

Tokuyama (www/tokuyama.co.jp) Reolosil fumed silica product data (6 pages) No pub date/info. (Year: 2018).*

(Continued)

*Primary Examiner* — Mark Kopec
(74) *Attorney, Agent, or Firm* — Wenderoth, Lind & Ponack, L.L.P.

(57) ABSTRACT

An adhesive film for a semiconductor chip with a through electrode, which is used for stacking multiple semiconductor chips each with a through electrode on a semiconductor wafer, which can favorably connect the through electrodes while suppressing formation of voids, and which can reduce the length of burrs protruding around the semiconductor chips. An adhesive film for a semiconductor chip with a through electrode, to be used for stacking multiple semiconductor chips each with a through electrode on a semiconductor wafer, the adhesive film having a minimum melt viscosity of 50 to 2500 Pa·s and a thixotropic index at 140° C. of 8 or lower.

2 Claims, 1 Drawing Sheet

(51) Int. Cl.
    H01L 25/00      (2006.01)
    H01L 21/52      (2006.01)
    C01B 33/18      (2006.01)
    C09C 1/30       (2006.01)
    C09J 133/00     (2006.01)
    H01L 23/00      (2006.01)
    H01L 25/065     (2006.01)
    C08G 59/42      (2006.01)
    C08G 59/50      (2006.01)
    C08L 33/06      (2006.01)
    C09J 7/10       (2018.01)
    C08K 3/36       (2006.01)
    C08K 3/013      (2018.01)

(52) U.S. Cl.
    CPC .......... *C08G 59/5073* (2013.01); *C08L 33/06* (2013.01); *C09C 1/30* (2013.01); *C09J 7/10* (2018.01); *C09J 133/00* (2013.01); *H01B 1/20* (2013.01); *H01L 21/52* (2013.01); *H01L 24/27* (2013.01); *H01L 24/29* (2013.01); *H01L 24/81* (2013.01); *H01L 24/83* (2013.01); *H01L 24/92* (2013.01); *H01L 24/97* (2013.01); *H01L 25/0657* (2013.01); *H01L 25/50* (2013.01); *C01P 2004/32* (2013.01); *C01P 2004/62* (2013.01); *C01P 2004/64* (2013.01); *C08K 3/013* (2018.01); *C08K 3/36* (2013.01); *C08K 2201/014* (2013.01); *C09J 2203/326* (2013.01); *C09J 2205/102* (2013.01); *C09J 2433/00* (2013.01); *C09J 2463/00* (2013.01); *H01L 24/13* (2013.01); *H01L 24/32* (2013.01); *H01L 2224/16146* (2013.01); *H01L 2224/271* (2013.01); *H01L 2224/29006* (2013.01); *H01L 2224/2929* (2013.01); *H01L 2224/29387* (2013.01); *H01L 2224/29388* (2013.01); *H01L 2224/29393* (2013.01); *H01L 2224/29499* (2013.01); *H01L 2224/32145* (2013.01); *H01L 2224/81203* (2013.01); *H01L 2224/81815* (2013.01); *H01L 2224/81907* (2013.01); *H01L 2224/83101* (2013.01); *H01L 2224/83203* (2013.01); *H01L 2224/83862* (2013.01); *H01L 2224/83907* (2013.01); *H01L 2224/83948* (2013.01); *H01L 2224/9211* (2013.01); *H01L 2224/97* (2013.01); *H01L 2225/06513* (2013.01); *H01L 2225/06517* (2013.01); *H01L 2225/06541* (2013.01)

(56) References Cited

FOREIGN PATENT DOCUMENTS

| JP | 2007-051184 | 3/2007 |
| JP | 2008-117916 | 5/2008 |
| JP | 2009-124115 | 6/2009 |
| JP | 2009-149727 | 7/2009 |
| JP | 2011-202177 | 10/2011 |
| JP | 2013-140895 | 7/2013 |
| JP | 2013-219286 | 10/2013 |
| JP | 2014-045032 | 3/2014 |
| WO | 2008/018557 | 2/2008 |
| WO | 2009/054255 | 4/2009 |

OTHER PUBLICATIONS

Written Opinion dated Jun. 23, 2015 in corresponding International (PCT) Application No. PCT/JP2015/059176 (English translation).
International Search Report dated Jun. 23, 2015 in corresponding International (PCT) Application No. PCT/JP2015/059176.

* cited by examiner

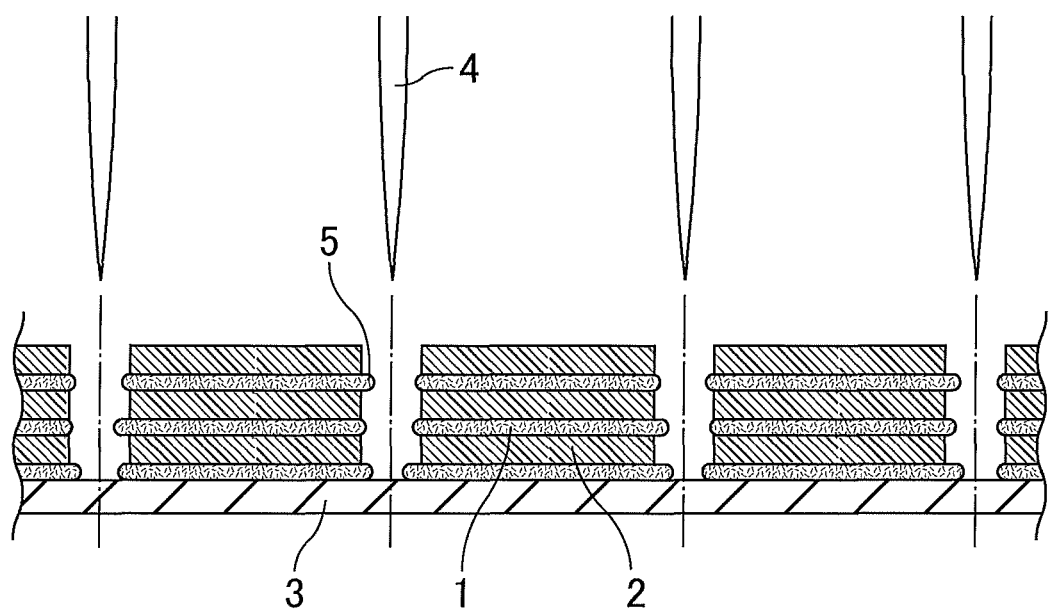

ADHESIVE FILM FOR SEMICONDUCTOR CHIP WITH THROUGH ELECTRODE

TECHNICAL FIELD

The present invention relates to an adhesive film for a semiconductor chip with a through electrode, which is used for stacking multiple semiconductor chips each with a through electrode on a semiconductor wafer, which can favorably bond the through electrodes while suppressing formation of voids, and which can reduce the length of burrs protruding around the semiconductor chips.

BACKGROUND ART

Recently, attention has been paid to flip chip mounting using a semiconductor chip with a bump electrode (bump) made of solder or the like.

In the flip chip mounting, commonly, a semiconductor chip is bonded to a substrate, and a sealing resin is injected. Patent Literature 1 discloses a sealing resin having a viscosity of 50 Pa·s or lower (25° C.) and a viscosity upon injection of 2 Pa·s or lower.

Along with recent downsizing of semiconductor chips, the pitch between electrodes has become narrower. In addition, the gap between semiconductor chips or between a semiconductor chip and a substrate has also become narrower. Such a situation has developed a method of bonding a semiconductor chip to a substrate on which a liquid adhesive is preliminary applied, instead of injecting a sealing resin after the bonding. Patent Literature 2 discloses a liquid epoxy resin composition having a thixotropic index before curing of 1.1 to 4.0 which can be applied while keeping its form.

A semiconductor chip is also bonded to a substrate or a semiconductor chip using an adhesive film (NCF) preliminarily attached to the substrate or the semiconductor chip. Patent Literature 3 discloses a sheet-like adhesive having a minimum melt viscosity within a range of 40 Pa·s to 5100 Pa·s. In relation to a problem that a sheet-like adhesive partially oozes out in a lateral direction upon pressure bonding to spread over a side face to reach the top face of the semiconductor element, the sheet-like adhesive according to Patent Literature 3 favorably suppresses protrusion of the adhesive in a lateral direction, so that defective products due to undesired protrusion of the adhesive are less likely to be produced.

In such a method, however, air bubbles (voids) may be formed between electrodes upon bonding. Moreover, since "bonding of electrodes" and "curing of an adhesive film" are carried out at the same time by heating, compatible achievement of precise bonding of electrodes and suppression of formation of voids is not easy.

A type of the flip chip mounting drawing attention recently is a three-dimensional stacking technique using a through silicon via (TSV) that enables significant improvement in performance and downsizing of a device produced by stacking multiple semiconductor chips.

In the stacking technique using TSV, commonly, multiple semiconductor chips each with a through electrode (TSV chips) are stacked on a semiconductor wafer at each of bonding sites formed in a grid pattern using an adhesive film provided between respective chips. Then, the semiconductor wafer was cut along dicing lines in a grid pattern, thereby producing a multilayer semiconductor chip laminate.

However, since semiconductor chips of the same size are stacked, adhesive films problematically protrude around the semiconductor chips to form burrs. Such burrs (edge portions, end portions) may be formed at any portions between the stacked semiconductor chips. Long burrs tend to fall off during dicing to contaminate the surroundings, leading to defective products. Though a wide interval between dicing lines can prevent long burrs from falling off during dicing, the interval of dicing lines is desired to be narrowed in terms of productivity.

The sheet-like adhesive disclosed in Patent Literature 3, for example, can be applied to the stacking technique using TSV. However, since the sheet-like adhesive is originally designed to suppress protrusion of the adhesive in a lateral direction upon bonding of a semiconductor chip to a substrate and not intended to be used for stacking multiple semiconductor chips, the length of burrs cannot be sufficiently reduced.

CITATION LIST

Patent Literature

Patent Literature 1: WO 08/018557
Patent Literature 2: JP 2007-51184 A
Patent Literature 3: JP 2007-09022 A

SUMMARY OF INVENTION

Technical Problem

The present invention aims to provide an adhesive film for a semiconductor chip with a through electrode, which is used for stacking multiple semiconductor chips each with a through electrode on a semiconductor wafer, which can favorably bond the through electrodes while suppressing formation of voids, and which can reduce the length of burrs protruding around the semiconductor chips.

Solution to Problem

The present invention relates to an adhesive film for a semiconductor chip with a through electrode, to be used for stacking multiple semiconductor chips each with a through electrode on a semiconductor wafer, the adhesive film having a minimum melt viscosity of 50 to 2500 Pa·s and a thixotropic index at 140° C. of 8 or lower.

The present invention is described in detail below.

The present inventors have found out that in a case where an adhesive film for a semiconductor chip with a through electrode used for stacking multiple semiconductor chips each with a through electrode on a semiconductor wafer has a minimum melt viscosity and a thixotropic index at 140° C. each adjusted within a specific narrow range, the through electrodes can be favorably bonded while formation of voids is suppressed, and burrs protruding around the semiconductor chips can be reduced. Moreover, the present inventors have also found out that such an adhesive film for a semiconductor chip with a through electrode fits to the periphery of the semiconductor chips to protrude approximately hemispherically like a droplet gradually growing, and therefore, the use of the adhesive film not only reduces the amount of burrs but also suppresses formation of long burrs. The present invention was thus completed.

The adhesive film for a semiconductor chip with a through electrode of the present invention is used for stacking multiple semiconductor chips each with a through electrode on a semiconductor wafer.

The adhesive film for a semiconductor chip with a through electrode of the present invention has a minimum melt viscosity of 50 to 2500 Pa·s and a thixotropic index at 140° C. of 8 or lower. Having a minimum melt viscosity and a thixotropic index at 140° C. each within such a narrow range, the adhesive film for a semiconductor chip with a through electrode of the present invention can favorably bond through electrodes while suppressing formation of voids and further can reduce the amount of burrs protruding around semiconductor chips. Moreover, since the adhesive film for a semiconductor chip with a through electrode of the present invention fits to the periphery of the semiconductor chips to protrude approximately hemispherically like a droplet gradually growing, long burrs are less likely to be formed.

When the minimum melt viscosity is less than 50 Pa·s, voids tends to be formed between electrodes during bonding of semiconductor chips each with a through electrode. When the minimum melt viscosity is more than 2500 Pa·s, bonding of through electrodes tends to be blocked. The lower limit of the minimum melt viscosity is preferably 70 Pa·s, more preferably 100 Pa·s, and the upper limit thereof is preferably 2300 Pa·s, more preferably 2000 Pa·s.

The minimum melt viscosity refers to a minimum complex viscosity $\eta^*$min in a temperature range from an ambient temperature to the melting point of solder, and can be determined by measuring the viscosity of the adhesive film for a semiconductor chip with a through electrode using a rheometer (e.g., STRESSTECH produced by REOLOGICA) under the conditions of a sample thickness of 600 µm in a strain control mode (1 rad) at a frequency of 10 Hz and a rate of temperature rise of 20° C./min within a measurement temperature range of 60° C. to 300° C.

When the thixotropic index at 140° C. is higher than 8, the length of burrs protruding around the semiconductor chips cannot be sufficiently reduced, and the burrs fall off during dicing to contaminate surroundings, leading to defective products. The upper limit of the thixotropic index at 140° C. is preferably 7, more preferably 6. The lower limit of the thixotropic index at 140° C. is not particularly limited. In terms of the shape retention of the film, the lower limit is preferably 1.5.

The thixotropic index at 140° C. is a value calculated by {complex viscosity $\eta^*$ (1 Hz)}/{complex viscosity $\eta^*$ (10 Hz)}, and can be determined by measuring the viscosity of the adhesive film for a semiconductor chip with a through electrode using a rheometer (e.g., STRESSTECH produced by REOLOGICA) under the conditions of a sample thickness of 600 µm in a strain control mode (1 rad) at a frequency of 1 Hz or 10 Hz and a temperature of 140° C. Upon stacking multiple semiconductor chips each with a through electrode on a semiconductor wafer, the adhesive film for a semiconductor chip with a through electrode is exposed to a temperature of about 80° C. to 160° C. before curing to be molten to some extent. The thixotropic index at 140° C. is therefore employed here as a typical thixotropic index within this temperature range.

The minimum melt viscosity and the thixotropic index at 140° C. are adjusted within the above ranges, for example, by adding inorganic filler(s) to the adhesive film for a semiconductor chip with a through electrode of the present invention preferably containing a thermosetting resin and a thermosetting agent. Particularly, preferred are a method of adjusting the average particle size and the amount of inorganic filler(s) or a method of controlling how to add inorganic filler(s).

The method of adjusting the average particle size and the amount of inorganic filler(s) may be a method of using two or more types of inorganic fillers different in the average particle size in combination. More specifically, for example, an inorganic filler (A) having an average particle size of 10 to 100 nm and an inorganic filler (B) having an average particle size of 150 to 500 nm may be used in combination. Such combination use of the inorganic filler (A) having a comparatively small average particle size and the inorganic filler (B) having a comparatively large average particle size facilitates adjustment of the thixotropic index at 140° C. within the above range. As a result, adjustment of the thixotropic index of the adhesive film for a semiconductor chip with a through electrode of the present invention during melting is facilitated, though the adhesive film is a film-shaped adhesive that is commonly considered to be difficult to adjust the thixotropic index during melting.

In the method of adjusting the average particle size and the amount of the inorganic filler(s), when the average particle size of the inorganic filler (A) is less than 10 nm, the flowability of the adhesive film for a semiconductor chip with a through electrode may be lowered, possibly leading to inappropriate bonding of the electrodes. When the average particle size of the inorganic filler (A) is more than 100 nm, the difference in the average particle size between the inorganic filler (A) and the inorganic filler (B) becomes small, and therefore, the effect of using two or more types of inorganic fillers different in the average particle size in combination may be hardly achieved. The lower limit of the average particle size of the inorganic filler (A) is more preferably 15 nm, and the upper limit thereof is more preferably 80 nm.

The average particle size of an inorganic filler can be measured using a transmission electron microscope, a scanning electron microscope, or a dynamic light scattering measuring device (e.g., N4 Plus Submicron Particle Size Analyzer produced by Beckman Coulter) with which the weight average particle size is measured.

In the method of adjusting the average particle size and the amount of the inorganic filler(s), when the average particle size of the inorganic filler (B) is less than 150 nm, the difference in the average particle size between the inorganic filler (A) and the inorganic filler (B) becomes small, and therefore, the effect of using two or more types of inorganic fillers different in the average particle size in combination may be hardly achieved. When the average particle size of the inorganic filler (B) is more than 500 nm, the inorganic filler (B) may be caught between through electrodes or the light transmittance of the adhesive film for a semiconductor chip with a through electrode may be lowered to possibly cause poor alignment of the semiconductor wafer with the semiconductor chips with a through electrode. The lower limit of the average particle size of the inorganic filler (B) is more preferably 200 nm, and the upper limit thereof is more preferably 400 nm.

In the method of adjusting the average particle size and the amount of the inorganic filler(s), the amount of the inorganic filler (A) and the amount of the inorganic filler (B) are preferably 5 to 40% by weight and 5 to 50% by weight, respectively, in the adhesive film for a semiconductor chip with a through electrode. When the amounts of these inorganic fillers are not within the above ranges, the minimum melt viscosity and the thixotropic index at 140° C. may become difficult to adjust.

The lower limit of the amount of the inorganic filler (A) is more preferably 10% by weight, still more preferably 15% by weight, and the upper limit thereof is more preferably 38% by weight, still more preferably 35% by weight.

The lower limit of the amount of the inorganic filler (B) is more preferably 10% by weight, still more preferably 15% by weight, and the upper limit thereof is more preferably 47% by weight, still more preferably 45% by weight.

The inorganic fillers may be made of any material, and examples of the material include silica such as fumed silica and colloidal silica, alumina, aluminum nitride, boron nitride, silicon nitride, glass powder, and glass frits.

The method of controlling how to add inorganic filler(s) may be a method of dividedly adding an inorganic filler suspension containing inorganic filler(s) suspended in a solvent to a mixture containing components other than the inorganic filler(s) in a plurality of times to prepare a resin composition and then producing an adhesive film for a semiconductor chip with a through electrode using the resin composition. Addition of a large amount of inorganic filler(s) at once causes aggregation of the inorganic filler(s) to lower the dispersibility. In such a case, the thixotropic index at 140° C. is difficult to adjust within the predetermined range. Divided addition of an inorganic filler suspension containing inorganic filler(s) suspended in a solvent prevents aggregation of the inorganic filler(s), leading to production of an adhesive film for a semiconductor chip with a through electrode having a predetermined thixotropic index.

Any inorganic filler may be used in the method of controlling how to add inorganic filler(s). For example, the inorganic filler (A) may be used alone, the inorganic filler (B) may be used alone, or the inorganic filler (A) and the inorganic filler (B) may be used in combination. The amount(s) of the inorganic filler (A) and/or the inorganic filler (B) may be set within the same range(s) as that/those for the method for adjusting the average particle size and the amount of inorganic filler(s).

Since the adhesive film for a semiconductor chip with a through electrode of the present invention contains the inorganic filler(s), adjustment of the minimum melt viscosity and the thixotropic index at 140° C. within the above ranges is facilitated, and moreover, the linear expansion coefficient of the adhesive film for a semiconductor chip with a through electrode after curing is lowered to favorably prevent generation of a stress to semiconductor chips or the like and occurrence of cracks at conductive parts such as solder.

The total amount of the inorganic filler(s) is not particularly limited, and the lower limit thereof is preferably 5 parts by weight and the upper limit thereof is preferably 500 parts by weight relative to 100 parts by weight of the total of a thermosetting resin and a polymer compound which will be described later. When the total amount of the inorganic filler(s) is less than 5 parts by weight, the effect of adding the inorganic filler(s) may be hardly achieved. When the total amount of the inorganic filler(s) is more than 500 parts by weight, the adhesive film for a semiconductor chip with a through electrode after curing has a lower linear expansion coefficient but has an increased tensile elastic modulus, which may tend to cause a stress to semiconductor chips or the like and cracks at conductive parts such as solder. The lower limit of the total amount of the inorganic filler(s) is more preferably 10 parts by weight, still more preferably 15 parts by weight, and the upper limit thereof is more preferably 400 parts by weight, still more preferably 300 parts by weight.

The adhesive film for a semiconductor chip with a through electrode of the present invention preferably contains a thermosetting resin and a thermosetting agent.

Any thermosetting resin may be used, and examples thereof include compounds that are cured by a reaction such as addition polymerization, polycondensation, polyaddition, addition condensation, or ring-opening polymerization. Specific examples of the thermosetting resin include urea resins, melamine resins, phenolic resins, resorcinol resins, epoxy resins, acrylic resins, polyester resins, polyamide resins, polybenzimidazole resins, diallylphthalate resins, xylene resins, alkyl-benzene resins, epoxy acrylate resins, silicon resins, and urethane resins.

Any epoxy resin may be used, and examples thereof include epoxy resins having a softening point of 150° C. or lower and epoxy resins that are liquid or crystalline solid at ambient temperatures. These epoxy resins may be used alone or in combination of two or more thereof.

When containing the epoxy resin, the adhesive film for a semiconductor chip with a through electrode of the present invention may further contain a polymer compound having a functional group reactive with the epoxy resin (also simply referred to as a polymer compound). The polymer compound serves as a film-forming component. Containing the polymer compound, the cured adhesive film for a semiconductor chip with a through electrode is tough to exhibit excellent impact resistance.

Any polymer compound may be used, and examples thereof include polymer compounds having an amino group, a urethane group, an imide group, a hydroxy group, a carboxyl group, or an epoxy group. Particularly preferred are polymer compounds having an epoxy group. Containing the polymer compound having an epoxy group, the cured adhesive film for a semiconductor chip with a through electrode has excellent mechanical strength, heat resistance, and moisture resistance derived from the epoxy resin and also has excellent toughness derived from the polymer compound having an epoxy group, exhibiting high bonding reliability and connection reliability.

The polymer compound having an epoxy group is not particularly limited as long as it is a polymer compound having an epoxy group at an end and/or a side chain (pendant position). Examples thereof include epoxy group-containing acrylic rubbers, epoxy group-containing polybutadiene rubbers, bisphenol-type high molecular weight epoxy resins, epoxy group-containing phenoxy resins, epoxy group-containing acrylic resins, epoxy group-containing urethane resins, and epoxy group-containing polyester resins.

Any thermosetting agent may be used, and examples thereof include phenolic curing agents, thiol curing agents, amine curing agents, and acid anhydride curing agents.

The amount of the thermosetting agent is not particularly limited, and the lower limit thereof is preferably 5 parts by weight and the upper limit thereof is preferably 150 parts by weight based on 100 parts by weight of the total of the thermosetting resin and the polymer compound. When the amount of the thermosetting agent is less than 5 parts by weight, the cured adhesive film for a semiconductor chip with a through electrode is hard and brittle to possibly be poor in bonding reliability. When the amount of the thermosetting agent is more than 150 parts by weight, the adhesive film for a semiconductor chip with a through electrode may also be poor in bonding reliability. The lower limit of the amount of the thermosetting agent is more preferably 10 parts by weight and the upper limit thereof is more preferably 140 parts by weight.

The adhesive film for a semiconductor chip with a through electrode of the present invention may further contain a curing accelerator.

Any curing accelerator may be used, and preferred is an imidazole compound. Since the imidazole compound is highly reactive with the epoxy resin, the adhesive film for a semiconductor chip with a through electrode containing the epoxy resin and the imidazole compound has better quick curability.

The adhesive film for a semiconductor chip with a through electrode of the present invention may contain a diluent within a range that the effect of the present invention is not impaired. Any diluent may be used, and preferred is a reactive diluent to be incorporated into the curing system of the adhesive film for a semiconductor chip with a through electrode. More preferred is a reactive diluent having two or more functional groups in a molecule for preventing a decrease in bonding reliability of the adhesive film for a semiconductor chip with a through electrode.

The amount of the diluent is not particularly limited, and the lower limit thereof is preferably 1 part by weight and the upper limit thereof is preferably 300 parts by weight based on 100 parts by weight of the total of the thermosetting resin and the polymer compound. When the amount of the diluent is less than 1 part by weight, the effect of adding the diluent may be hardly achieved. When the amount of the diluent is more than 300 parts by weight, the cured adhesive film for a semiconductor chip with a through electrode is hard and brittle to possibly be poor in bonding reliability. The lower limit of the amount of the diluent is more preferably 5 parts by weight and the upper limit thereof is more preferably 200 parts by weight.

The adhesive film for a semiconductor chip with a through electrode of the present invention may contain an inorganic ion exchanger, if needed. The amount of the inorganic ion exchanger is not particularly limited, and the lower limit thereof is preferably 1% by weight and the upper limit thereof is preferably 10% by weight in the adhesive film for a semiconductor chip with a through electrode of the present invention.

The adhesive film for a semiconductor chip with a through electrode of the present invention may contain other additives such as a bleed inhibitor, a silane coupling agent, a flux agent, or a thickener, if needed.

The adhesive film for a semiconductor chip with a through electrode of the present invention may be produced by any method. An exemplary method includes mixing, as needed, a thermosetting resin, a thermosetting agent, a curing accelerator, a polymer compound, an inorganic filler, a solvent, and other additive(s) each in a predetermined amount to give a resin composition, applying the resin composition onto a mold release film, and drying the applied resin composition. Any mixing method may be employed, and a method of using a homogenizing disperser, a universal mixer, a Bunbury mixer, a kneader, or the like may be employed.

The adhesive film for a semiconductor chip with a through electrode of the present invention is used for stacking multiple semiconductor chips each with a through electrode on a semiconductor wafer.

Multiple semiconductor chips each with a through electrode may be stacked on a semiconductor wafer using the adhesive film for a semiconductor chip with a through electrode of the present invention by any method. A preferred method includes step (1) of temporarily attaching a first semiconductor chip with a through electrode to a bonding site on a semiconductor wafer using the adhesive film for a semiconductor chip with a through electrode of the present invention, step (2) of temporarily attaching a second semiconductor chip with a through electrode to the first semiconductor chip with a through electrode using the adhesive film for a semiconductor chip with a through electrode of the present invention, step (3) of repeating the step (2) as needed, and step (4) of heating the resulting temporarily attached members to bond the through electrodes.

In the step (1), the first semiconductor chip with a through electrode may be temporarily attached to the bonding site on the semiconductor wafer by any method. In an exemplary method, the adhesive film for a semiconductor chip with a through electrode of the present invention is supplied to the first semiconductor chip with a through electrode, the first semiconductor chip with a through electrode is then aligned to the bonding site on the semiconductor wafer using a mounting device such as a flip chip bonder, and the adhesive film for a semiconductor chip with a through electrode of the present invention is heated at a predetermined temperature (also referred to as a temporarily attaching temperature) for a predetermined time (also referred to as a temporarily attaching time).

The adhesive film for a semiconductor chip with a through electrode of the present invention may be supplied to the first semiconductor chip with a through electrode by any method. Exemplary methods include a method of laminating a semiconductor chip with a through electrode with the adhesive film for a semiconductor chip with a through electrode of the present invention and a method of laminating a semiconductor wafer with a through electrode with the adhesive film for a semiconductor chip with a through electrode of the present invention and then dicing the semiconductor wafer with a through electrode.

Control of the temporarily attaching temperature and the temporarily attaching time allows the adhesive film for a semiconductor chip with a through electrode of the present invention to be not completely cured but attaches the first semiconductor chip with a through electrode to the bonding site on the semiconductor wafer to some extent (i.e., temporarily attachment). In such a temporarily attached state, the through electrodes are not bonded yet. The through electrodes are bonded in the step (4) described later.

The temporarily attaching temperature is not particularly limited, and is a temperature that enables temporarily attachment and is lower than the curing temperature of the adhesive film for a semiconductor chip with a through electrode of the present invention. As for the difference between the temporarily attaching temperature and the curing temperature of the adhesive film for a semiconductor chip with a through electrode of the present invention, the lower limit is preferably 10° C., more preferably 15° C., and the upper limit is preferably 200° C., more preferably 150° C. Specifically, the temporarily attaching temperature is preferably about 40° C. to 200° C., more preferably about 60° C. to 180° C.

The temporarily attaching time is preferably 0.1 to 60 seconds.

In the step (2) and the step (3), semiconductor chips each with a through electrode may be temporarily attached by the same method as in the step (1).

Through these steps, electrodes of multiple semiconductor chips each with a through electrode temporarily attached on the semiconductor wafer can be bonded at once. In comparison with the case where stacking of a semiconductor chip with a through electrode and bonding of the electrodes are performed one by one, the productivity can be improved. In addition, the productivity can be further improved by bonding electrodes of multiple sets of temporarily attached members on the semiconductor wafer at once.

In the step (4), the temporarily attached members may be heated for bonding of the electrodes by any method. In an exemplary method in the case where the through electrodes are solder electrodes, the temporarily attached members are heated at a contact temperature (temperature for contacting electrodes) of about 60° C. to 220° C. for 0.1 to 60 seconds and then at a temperature of about 230° C. to 300° C. that is not lower than the solder melting temperature for 0.1 to 60 seconds using a mounting device such as a flip chip bonder.

Control of the heating conditions enables favorable bonding of the electrodes. Depending on the heating conditions, the adhesive film for a semiconductor chip with a through electrode of the present invention is completely cured and favorably attaches multiple semiconductor chips each with a through electrode.

In the step (4), the uppermost semiconductor chip with a through electrode is preferably pressurized for bonding of the electrodes and filling of a sealing region with the adhesive film for a semiconductor chip with a through electrode of the present invention.

The pressure for the pressurization is not particularly limited and is preferably 1 to 200 N. The pressure applied per electrode is preferably 0.0001 to 1 N. When the pressure applied per electrode is less than 0.0001 N, the electrodes may not contact one another. When the pressure applied per electrode is more than 1 N, the electrode may be excessively crushed to contact an adjacent electrode, resulting in short circuit.

In the step (4), the adhesive film for a semiconductor chip with a through electrode of the present invention may be completely cured or halfway cured. In the case where the adhesive film for a semiconductor chip with a through electrode of the present invention is not completely cured but halfway cured during bonding of the electrodes, heating may be performed in two stages in which the electrodes are bonded first and then the adhesive film for a semiconductor chip with a through electrode of the present invention is completely cured.

After the steps (1) to (4), step (5) of completely curing the adhesive film for a semiconductor chip with a through electrode of the present invention may be further performed.

The adhesive film for a semiconductor chip with a through electrode of the present invention may be completely cured after bonding of the electrodes, if needed. The temporarily attached members need not to be heated all at once with an aim of concurrently performing bonding of the electrodes and curing of the adhesive film for a semiconductor chip with a through electrode of the present invention, which prevents a problem of reduction in yield due to nonuniform heating that is caused by variation in the thickness of the semiconductor chips with a through electrode or variation in the height of the through electrodes.

Through the steps (1) to (4) and optionally the step (5), multiple semiconductor chips each with a through electrode can be stacked on a semiconductor wafer using the adhesive film for a semiconductor chip with a through electrode of the present invention.

FIG. 1 is a cross-sectional view schematically illustrating an exemplary state where multiple semiconductor chips each with a through electrode are stacked on a semiconductor wafer using the adhesive films for a semiconductor chip with a through electrode of the present invention. In FIG. 1, multiple semiconductor chips 2 each with a through electrode are stacked on a semiconductor wafer 3 using the adhesive films 1 for a semiconductor chip with a through electrode of the present invention.

The use of the adhesive film 1 for a semiconductor chip with a through electrode of the present invention can reduce the length of burrs 5 protruding around the semiconductor chips. Accordingly, the burrs are prevented from falling off during dicing of the semiconductor wafer 3 along grid-shaped dicing lines with a dicing blade 4, so that contamination of the surroundings can be suppressed. Moreover, since the length of the burrs 5 is reduced, the interval of dicing lines can be narrowed, further improving the productivity.

Advantageous Effects of Invention

The present invention can provide an adhesive film for a semiconductor chip with a through electrode, which is used for stacking multiple semiconductor chips each with a through electrode on a semiconductor wafer, which can favorably bond the through electrodes while suppressing formation of voids, and which can reduce the length of burrs protruding around the semiconductor chips.

BRIEF DESCRIPTION OF DRAWINGS

FIG. 1 is a cross-sectional view schematically illustrating an exemplary state where multiple semiconductor chips each with a through electrode are stacked on a semiconductor wafer using the adhesive films for a semiconductor chip with a through electrode of the present invention.

DESCRIPTION OF EMBODIMENTS

Embodiments of the present invention are specifically described in the following with reference to, but not limited to, examples.

Example 1

(1) Production of Adhesive Film
(Method A)

To a solvent were added materials shown below and in Table 1 other than inorganic filler(s) in accordance with the compositions shown in Tables 2 and 3, and stirred to give a mixture. An inorganic filler suspension was prepared by suspending inorganic filler(s) in a solvent and divided into two equal portions. The two portions of the filler suspension were added to the mixture one by one and stirred to give a resin composition. The obtained resin composition was applied to a mold release film and dried, thereby preparing an adhesive film.

(Method B)

To a solvent were added materials shown below and in Table 1 in accordance with the compositions shown in Tables 2 and 3 to give a resin composition. The obtained resin composition was applied to a mold release film and dried, thereby preparing an adhesive film.

1. Thermosetting Resin

Bisphenol-A solid epoxy resin (1004AF, produced by Mitsubishi Chemical Corporation)

Bisphenol-F liquid epoxy resin (EXA-830CRP, produced by DIC Corporation)

Dicyclopentadiene epoxy resin (HP7200HH, produced by DIC Corporation)

Glycidyl amine epoxy resin (EP-4088L, produced by ADEKA Corporation)

2. Polymer Compound

Acrylic resin (G-2050M, produced by NOF Corporation)

3. Thermosetting Agent and Curing Accelerator

Acid anhydride (YH-309, produced by Mitsubishi Chemical Corporation)

Imidazole (2MAOK-PW, produced by Shikoku Chemicals Corporation)

4. Inorganic Filler 4-1. Inorganic Filler (A)

Spherical silica (YA010C-SP1, produced by Admatechs Company Limited, average particle size of 0.01 μm)

Spherical silica (YA050C-SP1, produced by Admatechs Company Limited, average particle size of 0.05 μm) Spherical silica (YC100C-SP1, produced by Admatechs Company Limited, average particle size of 0.1 μm) 4-2. Inorganic filler (B)

Spherical silica (SE1050-SPJ, produced by Admatechs Company Limited, average particle size of 0.3 μm)

Spherical silica (SE2050-SPJ, produced by Admatechs Company Limited, average particle size of 0.5 μm)

(2) Measurement of Minimum Melt Viscosity and Thixotropic Index at 140° C.

The minimum melt viscosity of each of the obtained adhesive films was determined as the minimum complex viscosity η*min in a temperature range from an ambient temperature to the melting point of solder. The minimum complex viscosity η*min was obtained by measuring the viscosity using a rheometer (STRESSTECH produced by REOLOGICA) under the conditions of a sample thickness of 600 μm in a strain control mode (1 rad) at a frequency of 10 Hz and a rate of temperature rise of 20° C./min within a measurement temperature range of 60° C. to 300° C.

The thixotropic index at 140° C. of each of the obtained adhesive films was determined by measuring the viscosity of the adhesive film using a rheometer (STRESSTECH produced by REOLOGICA) under the conditions of a sample thickness of 600 μm in a strain control mode (1 rad) at a frequency of 1 Hz or 10 Hz and a temperature of 140° C. and then calculating the value of {complex viscosity η* (1 Hz)}/{complex viscosity η* (10 Hz)}.

Tables 2 and 3 show the results.

<Evaluation>

The adhesive films obtained in the examples and comparative examples were evaluated for the following parameters. Tables 2 and 3 show the results.

(1) Evaluation of the Length of Burrs Protruding Around Semiconductor Chips

Silicon chips A1, A2, and A3 {TSV chips (thickness of 50 μm) each having a pad (φ20 μm, height of 10 μm) plated with Ni/Au formed on one surface, a cupper bump (φ20 μm, height of 10 μm) formed on the other surface, and a Sn-3.5Ag solder layer (thickness of 5 μm) formed on the cupper bump} and a silicon chip B {chip having a pad (φ20 μm, height of 10 μm) plated with Ni/Au formed on one surface and having no pad or bump on the other surface} were prepared.

In each of the silicon chips A1, A2, and A3, the surface where the cupper bump with a solder layer was formed was laminated with the adhesive film using a vacuum laminator (ATM-812M, produced by Takatori Corporation) under the conditions of a stage temperature of 80° C. and a vacuum degree of 100 Pa·s. The adhesive film protruding from the chip was cut by a cutter.

Ten sets of temporarily attached members were produced by the following method.

The surface where the adhesive film was attached of the silicon chip A1 was temporarily attached to the silicon chip B using a flip chip bonder (FC3000S, produced by Toray Engineering Co., Ltd.) under the conditions of a stage temperature of 60° C., a bonding tool temperature (temporarily attaching temperature) of 100° C. at 20 N for 2 seconds. Next, the surface where the adhesive film was attached of the silicon chip A2 was temporarily attached to the surface where no adhesive film was attached of the silicon chip A1 under the same conditions. In addition, the surface where the adhesive film was attached of the silicon chip A3 was temporarily attached to the surface where no adhesive film was attached of the silicon chip A2 under the same conditions. Thus produced temporarily attached members include the silicon chips A1, A2, and A3 stacked to forma triple layer structure with use of the adhesive film on the surface where the pad was formed of the silicon chip B. At this time, copper bumps with a solder layer of the silicon chips were not soldered yet.

Next, 10 sets of the temporarily attached members were heated in the atmospheric pressure under the following temperature conditions for soldering the cupper bumps with a solder layer of the silicon chips. The load applied was 20 N. Then, 10 sets of the temporarily attached members were heated at 170° C. for 30 minutes for completely curing the adhesive films. Thus, 10 semiconductor devices were prepared.

(Temperature Condition)

1. Heating at 100° C. for 5 seconds
2. Temperature increase from 100° C. to 280° C. in 5 seconds
3. Kept at 280° C. for 5 seconds
4. Temperature decrease from 280° C. to 100° C. in 5 seconds The obtained 10 semiconductor devices were magnified 300 times by an optical microscope, and each semiconductor device in the observation field was photographed from above. Each of the photographs was observed to find the longest part of burrs protruding around the silicon chips of each semiconductor device, and the length thereof (maximum length of burr) was measured. The average maximum length of burrs of 10 semiconductor devices was determined. The case where the average was 100 μm or less was rated Good (○) and the case where the average was more than 100 μm was rated Poor (x). For measurement of the maximum length of the burr, the length between the end portion of the semiconductor chip corresponding to the root of the burr and the portion of the burr farthest from the end portion of the semiconductor chip was measured.

(2) Shape of Bonded Through Electrodes

The semiconductor device obtained in (1) was subjected to cross section polishing (X-section), and the polished face was observed using a scanning electron microscope (SEM) (magnification: 3000 times) for evaluation of the shape of bonded bumps. The shape with no constriction under a load of 20 N was rated Excellent (○○). The shape with no constriction under a load of 40 N was rated Good (○). The shape with constriction under a load of 40 N was rated Not good (Δ). The shape with a gap between the bumps under a load of 40 N was rated Poor (x).

(3) Voids

The semiconductor device obtained in (1) was subjected to surface polishing, and the polished surface was observed using an optical microscope for determining the presence of voids between bumps or in the plane. The semiconductor device having no voids between bumps or in the plane was rated Good (○). The semiconductor device having no voids between bumps but having voids in the plane was rated Not good (Δ). The semiconductor device having voids both between bumps and in the plane was rated Poor (x).

TABLE 1

| | Product name | Manufacturer | Structure |
|---|---|---|---|
| Thermosetting resin | HP-7200HH | DIC Corporation | Dicyclopentadiene epoxy resin |
| | EXA-830CRP | DIC Corporation | Bisphenol-F epoxy resin |
| | EP-4088L | ADEKA Corporation | Glycidyl amine epoxy resin |
| | 1004AF | Mitsubishi Chemical Corporation | Bisphenol-A epoxy resin |
| Thermosetting agent | YH-309 | Mitsubishi Chemical Corporation | Acid anhydride |
| Curing accelerator | 2MAOK-PW | Shikoku Chemicals Corporation | Imidazole compound |

TABLE 1-continued

| | Product name | Manufacturer | Structure |
|---|---|---|---|
| Polymer compound | G-2050M | NOF Corporation | Acrylic resin |
| Inorganic filler | YA010C-SP1 | Admatechs Company Limited | Spherical silica |
| | YA050C-SP1 | Admatechs Company Limited | Spherical silica |
| | YC100C-SP1 | Admatechs Company Limited | Spherical silica |
| | SE1050-SPJ | Admatechs Company Limited | Spherical silica |
| | SE2050-SPJ | Admatechs Company Limited | Spherical silica |

TABLE 2

| | | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|---|
| Adhesive (parts by weight) | Thermosetting resin | 1004AF | 35 | 25 | 42 | 18 | 18 | — | 27 | 36 | — | — | — |
| | | HP-7200HH | — | — | — | — | — | 15 | — | — | 10 | 30 | 20 |
| | | EXA-830CRP | 15 | 20 | 18 | 20 | 24 | — | 27 | 18 | — | — | — |
| | | EP-4088L | — | — | — | — | — | 24 | — | — | 24 | 4 | 18 |
| | Thermosetting agent | YH-309 | 35 | 35 | 35 | 35 | 24 | 30 | 24 | 24 | 30 | 25 | 30 |
| | Curing accelerator | 2MAOK-PW | 3 | 3 | 3 | 3 | 2 | 1 | 2 | 2 | 1 | 3 | 2 |
| | Polymer compound | G-2050M | 12 | 15 | 12 | 25 | 30 | 30 | 20 | 18 | 35 | 38 | 30 |
| | Inorganic filler (A) | YA010C-SP1 | — | — | 5 | — | — | — | — | — | 2 | — | — |
| | | YA050C-SP1 | 50 | 50 | — | 50 | 50 | 100 | 40 | 60 | 98 | — | — |
| | | YC100C-SP1 | — | — | 50 | — | — | — | — | — | — | — | — |
| | Inorganic filler (B) | SE1050-SPJ | 50 | 50 | 50 | 50 | 50 | — | — | 130 | — | 67 | 50 |
| | | SE2050-SPJ | — | — | — | — | — | — | 60 | — | — | — | 50 |
| Amount of inorganic filler (wt %) | | | 50 | 50 | 50 | 50 | 50 | 50 | 50 | 65 | 50 | 40 | 50 |
| Production method of adhesive film | | | A | A | A | A | A | A | A | A | A | A | A |
| Evaluation | Melt viscosity (Pa · s) | | 75 | 120 | 230 | 375 | 775 | 1210 | 235 | 710 | 1650 | 1916 | 2440 |
| | Thixotropic index | | 4.1 | 3.7 | 4.5 | 4.4 | 4.7 | 7.3 | 2.7 | 6.8 | 7.9 | 5.5 | 5.2 |
| | Average maximum length of burrs | | ○ | ○ | ○ | ○ | ○ | ○ | ○ | ○ | ○ | ○ | ○ |
| | Shape of bonded through electrodes | | ○○ | ○○ | ○○ | ○○ | ○○ | ○ | ○○ | ○○ | ○ | ○ | ○ |
| | Voids | | Δ | ○ | ○ | ○ | ○ | ○ | ○ | ○ | ○ | ○ | ○ |

TABLE 3

| | | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|
| Adhesive (parts by weight) | Thermosetting resin | 1004AF | 44 | 48 | 48 | — | — | — | — | — |
| | | HP-7200HH | — | — | — | 10 | 28 | 10 | 30 | 20 |
| | | EXA-830CRP | 18 | 12 | 12 | — | — | — | — | — |
| | | EP-4088L | — | — | — | 24 | 4 | 24 | 4 | 18 |
| | Thermosetting agent | YH-309 | 42 | 24 | 24 | 30 | 25 | 30 | 25 | 30 |
| | Curing accelerator | 2MAOK-PW | 4 | 2 | 2 | 1 | 3 | 1 | 3 | 2 |
| | Polymer compound | G-2050M | 10 | 12 | 12 | 35 | 40 | 35 | 38 | 30 |
| | Inorganic filler (A) | YA010C-SP1 | — | 10 | 10 | 10 | — | 2 | — | — |
| | | YA050C-SP1 | 50 | — | — | 90 | — | 98 | — | — |
| | | YC100C-SP1 | — | 90 | 170 | — | — | — | — | — |
| | Inorganic filler (B) | SE1050-SPJ | 50 | — | — | — | 82 | — | 67 | 50 |
| | | SE2050-SPJ | — | — | — | — | — | — | — | 50 |

TABLE 3-continued

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Amount of inorganic filler (wt %) | | 50 | 50 | 65 | 50 | 45 | 50 | 40 | 50 |
| Production method of adhesive film | | A | A | A | A | A | B | B | B |
| Evaluation | Melt viscosity (Pa · s) | 40 | 440 | 840 | 2470 | 4708 | 1780 | 2543 | 2820 |
| | Thixotropic index | 3.9 | 8.5 | 9.5 | 13.0 | 5.02 | 9.1 | 8.3 | 8.9 |
| | Average maximum length of burrs | ○ | x | x | x | ○ | x | x | x |
| | Shape of bonded through electrodes | ○○ | ○○ | ○○ | ○ | x | ○ | ○ | ○ |
| | Voids | x | ○ | ○ | ○ | x | ○ | ○ | ○ |

INDUSTRIAL APPLICABILITY

The present invention can provide an adhesive film for a semiconductor chip with a through electrode, which is used for stacking multiple semiconductor chips each with a through electrode on a semiconductor wafer, which can favorably connect the through electrodes while suppressing formation of voids, and which can reduce the length of burrs protruding around the semiconductor chips.

REFERENCE SIGNS LIST

1: Adhesive film for a semiconductor chip with a through electrode of the present invention
2: Semiconductor chip with a through electrode
3: Semiconductor wafer
4: Dicing blade
5: Burr

The invention claimed is:
1. An adhesive film for a semiconductor chip with a through electrode, to be used for stacking multiple semiconductor chips each with a through electrode on a semiconductor wafer, the adhesive film comprising 10 to 40% by weight of an inorganic filler (A) having an average particle size of 10 to 100 nm and 10 to 50% by weight of an inorganic filler (B) having an average particle size of 150 to 500 nm, wherein the adhesive film has a minimum melt viscosity of 50 to 2500 Pa·s and a thixotropic index at 140° C. of 8 or lower.

2. The adhesive film for a semiconductor chip with a through electrode according to claim 1,
which is produced from a resin composition containing an inorganic filler (A) having an average particle size of 10 to 100 nm, an inorganic filler (B) having an average particle size of 150 to 500 nm, or both the inorganic filler (A) having an average particle size of 10 to 100 nm and the inorganic filler (B) having an average particle size of 150 to 500 nm, the resin composition being prepared by dividedly adding an inorganic filler suspension containing the inorganic filler(s) suspended in a solvent to a mixture containing components of the resin composition other than the inorganic filler in a plurality of times.

* * * * *